T868002

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED NOVEMBER 18, 1969

868 O.G. 730

687,450

LITHOGRAPHIC PLATE

Paul L. Johnstone, Greenville, and Richard L. Wagner, Sherwood Park, Del., assignors to Hercules Incorporated, Wilmington, Del., a corporation of Delaware

Filed Dec. 4, 1967. Published Nov. 18, 1969

Int. Cl. B41n *1/00, 3/00;* G03f *7/02*

U.S. Cl. 101—455

No Drawing. 11 Pages Specification

Lithographically grained metal plates closely resembling tub grained metal plates can be prepared by coating a smooth metal plate such as an aluminum or zinc plate, with an aqueous dispersion of (1) an alkali metal silicate such as sodium of potassium silicate, (2) boric acid, and (3) a finely divided metallic agent selected from aluminum hydroxide, aluminum oxide, aluminum, and zinc. If desired, the metal plates can be plastic or paper laminates faced with metal foil.

The aqueous dispersion used to coat the plates will contain from about 15% to about 75% of an alkali metal silicate, from about 0% to about 4% boric acid, and from about 22% to about 76% of finely divided metallic agent.

In the process of preparing the said plates, a coating of from about 0.1 mil to about 5 mils of the dispersion is applied to smooth metal sheets. If desired the coating can be cured by heating and sealed by dipping in an aqueous solution of an alkali metal silicate, draining, and then dipping in an aqueous solution of boric acid.